United States Patent
Singh et al.

(10) Patent No.: US 6,433,603 B1
(45) Date of Patent: Aug. 13, 2002

(54) PULSE-BASED HIGH SPEED FLOP CIRCUIT

(75) Inventors: Gajendra P. Singh, Sunnyvale; Joseph I. Chamdani, Santa Clara, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 80 days.

(21) Appl. No.: 09/638,236

(22) Filed: Aug. 14, 2000

(51) Int. Cl.[7] .............................................. H03K 3/356
(52) U.S. Cl. ...................... 327/211; 327/208; 327/210; 327/218; 327/259
(58) Field of Search ................................ 327/199–203, 327/208–212, 218, 250–259, 291, 295, 172, 173

(56) References Cited

U.S. PATENT DOCUMENTS

| | | | | |
|---|---|---|---|---|
| 3,862,440 A | * | 1/1975 | Suzuki et al. ................ | 327/173 |
| 4,827,157 A | * | 5/1989 | Machida et al. ............ | 327/259 |
| 5,377,158 A | | 12/1994 | Nishizawa ................... | 365/233 |
| 5,424,654 A | | 6/1995 | Kaplinsky .................... | 326/40 |
| 5,426,380 A | | 6/1995 | Rogers ......................... | 326/46 |
| 5,612,632 A | * | 3/1997 | Mahant-Shetti et al. ...... | 326/46 |
| 5,646,557 A | | 7/1997 | Runyon et al. ............... | 326/97 |
| 5,655,113 A | | 8/1997 | Leung et al. ................ | 395/552 |
| 5,793,236 A | | 8/1998 | Kosco ......................... | 327/218 |
| 5,825,224 A | | 10/1998 | Klass et al. .................. | 327/200 |
| 5,838,631 A | | 11/1998 | Mick ............................ | 365/233 |
| 5,844,844 A | | 12/1998 | Bauer et al. ............ | 365/189.05 |
| 5,861,761 A | | 1/1999 | Kean ............................ | 326/41 |
| 5,880,608 A | | 3/1999 | Mehta et al. ................ | 326/93 |
| 5,886,904 A | | 3/1999 | Dai et al. .................... | 364/578 |
| 6,211,713 B1 | * | 4/2001 | Uhlmann ..................... | 327/211 |
| 6,225,847 B1 | * | 5/2001 | Kim ............................ | 327/257 |

FOREIGN PATENT DOCUMENTS

| | | | | |
|---|---|---|---|---|
| GB | 2174856 | * | 11/1986 | .................. 327/218 |
| JP | 4-239810 | * | 8/1992 | .................. 327/218 |
| JP | 5-95257 | * | 4/1993 | .................. 327/218 |
| JP | 6-45879 | * | 2/1994 | .................. 327/218 |

OTHER PUBLICATIONS

Omondi, A. R. et al.: "Performance of a context cache for a multithreaded pipeline" Journal of Systems Architecture, Elsevier Science Publishers BV., Amsterdam, NL, vol. 45, No. 4, Dec. 1, 1998, pp. 305–322, XP004142885, ISSN: 1383–7621.

Notification of Transmittal of the International Search Report or the Declaration and International Search Report, mailed Jul. 3, 2002; International Application No. PCT/US01/25553; filed Aug. 14, 2001; Applicant—Sun Microsystems, Inc.; 7 pages.

* cited by examiner

Primary Examiner—Tuan T. Lam
(74) Attorney, Agent, or Firm—Skjerven Morrill LLP; Samuel G. Campbell, III

(57) ABSTRACT

An integrated circuit device for synchronization of data in a data path includes a driver and a storage element coupled to the driver for driving the storage element. The storage element is coupled to the data path outside the data path. The integrated circuit employs a method of operation including passing a time pulse, sampling data during the time pulse, passing the data to a computation logic along a data path, and storing the sampled data in a storage element connected to but outside the data path.

16 Claims, 16 Drawing Sheets

PULSE-BASED HIGH SPEED FLOP CIRCUIT

BACKGROUND OF THE INVENTION

A flip-flop is a 1-bit storage element that is commonly used in electronic circuits. The flip-flop is typically used to synchronize timing in a circuit and is one of the most frequently used circuits for reliably sampling and storing data. Accordingly, the flip-flop is a fundamental element of semiconductor circuits that have a single-phase clock.

Various types and structures of flip-flops have been employed in integrated circuits for many years. A flip-flop is a circuit element that greatly determines the overall clocking speed, thus the operating speed, of a processor or controller. FIG. 1 shows a timing diagram of a circuit such as a processor. The timing diagram includes a plurality of timing cycles. A timing cycle has several time segments that relate to functionality of timed circuits. For example, a flip-flop operates according to a timing cycle that includes a setup time $T_S$ and a propagation time $T_P$ that, in combination, determine a time penalty that arises from operation of the flip-flop. The setup time $T_S$ is the time duration that data must be applied to the flip-flop before the flip-flop is ready to store the data. The propagation time $T_P$ is the time duration to propagate the data through the flip-flop to computation logic.

Hold time $T_H$ is a time segment that expresses the time duration the data must be stable after the clock arrives so that computations are made on the correct data value. The hold time $T_H$ is a limitation on system accuracy rather than expressing a limitation on operating speed. Accordingly, the hold time $T_H$ is an implementation hazard rather than a time hazard.

Computation time $T_C$ is the time duration that is available for logic to perform computations. The computation time $T_C$ is theoretically equal to the clock cycle time minus the sum of setup time $T_S$ and propagation time $T_P$. To increase computation time $T_C$ and/or to increase operating speed, setup time $T_S$ or propagation time $T_P$ must be reduced.

Many attempts have been made to design faster flip-flops, for example where the sum of the setup time $T_S$ and propagation time $T_P$ is small and hold time $T_H$ is at a minimum, and more reliable flip-flops in the semiconductor industry, particularly in microprocessor designs.

What is needed is a flip-flop circuit that increases operating speed of the processor.

SUMMARY

An integrated circuit device for synchronization of data in a data path includes a driver and a storage element coupled to the driver for driving the storage element. The storage element is coupled to the data path outside the data path.

The integrated circuit employs a method of operation including passing a time pulse, sampling data during the time pulse, passing the data to a computation logic along a data path, and storing the sampled data in a storage element connected to but outside the data path.

In accordance with an aspect of usage of the integrated circuit device, a processor includes a control logic for executing computational and logic operations and a memory coupled to the control logic. The control logic and the memory include a plurality of flip-flops for synchronization of data in a data path. The flip-flops include a driver and a storage element coupled to the driver, the driver for driving the storage element, the storage element being coupled to the data path outside the data path.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIG. 10A is a schematic block diagram illustrating control and storage blocks of a circuit employing high-speed multiple-bit flip-flops. FIG. 10B is a schematic circuit diagram that shows a multiple-bit bistable multivibrator (flip-flop) circuit. FIG. 10C is a timing diagram illustrating timing of the multiple-bit flip-flop.

DESCRIPTION OF THE EMBODIMENTS

Figure 1:
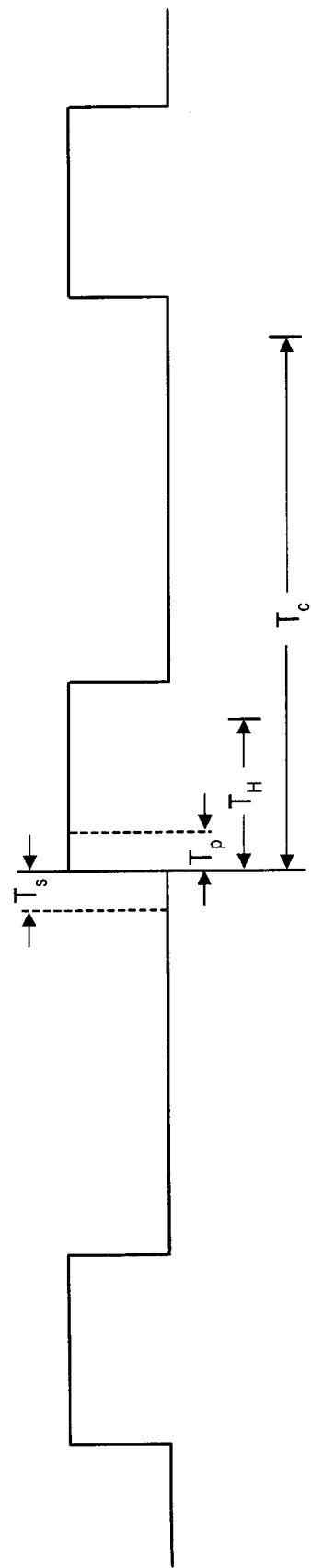
FIG. 1 is a schematic timing diagram representing clock cycles for a circuit such as a processor.
Figure 2:
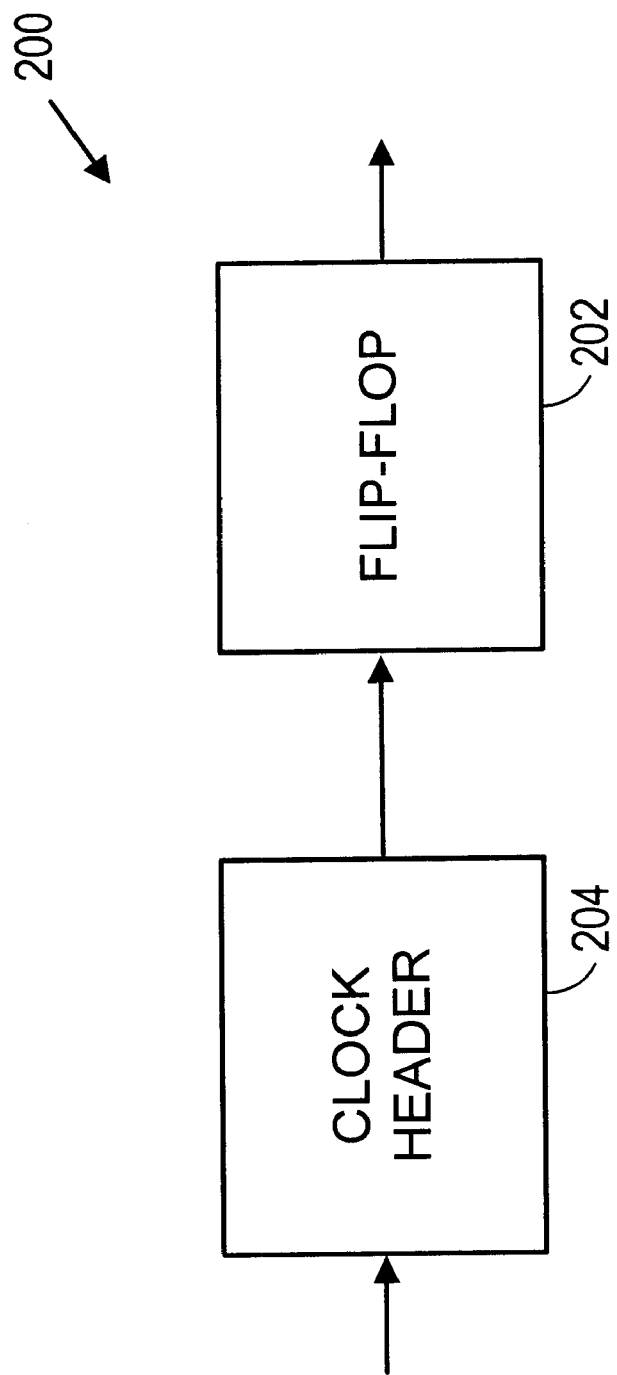
FIG. 2 is a schematic circuit diagram illustrating functional elements of a pulse-based high-speed flip-flop in accordance with an embodiment of the present invention.

Referring to FIG. 2, a schematic block diagram that depicts functional elements of a pulse-based high-speed flip-flop 200. The pulse-based high-speed flip-flop 200 includes a flop circuit 202 and a clock header circuit 204. The flop circuit 202 includes circuit elements for storage and drive functionality. The clock header circuit 204 supplies synchronized clock and inverted clock signals to drive the flop circuit 202.

The pulse-based high-speed flip-flop 200 is most suitably used as an edge-triggered flip-flop that can be configured to trigger on either the positive edge or the negative edge. The flop circuit 202 includes a static memory element and samples data in a short-duration time window to attain edge-triggered functionality. The static memory element in the flop circuit 202 is outside the path of data flow, differing from the memory element in conventional flip-flops. The conventional flip-flop design disadvantageously slows propagation of the data signal, reducing the time for data computation in each timing cycle, and reducing overall system speed.

The pulse-based high-speed flip-flop 200 advantageously has the storage element positioned outside the direct data flow path so that signal speed is not reduced.

Figure 3:
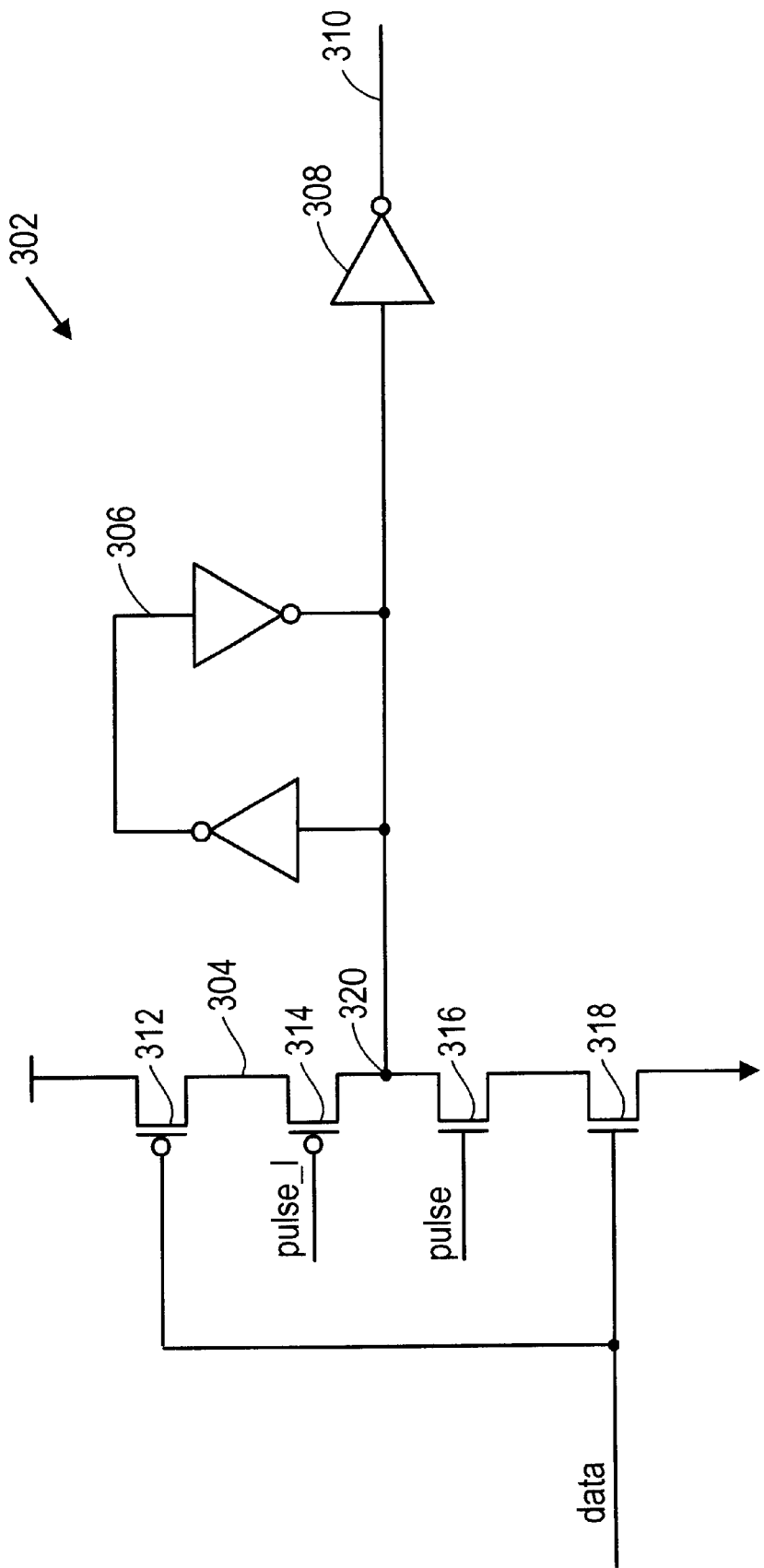
FIG. 3 is a schematic circuit diagram that shows an embodiment of a pulsed flop circuit that is suitable for usage in the pulse-based high-speed flip-flop shown in FIG. 2.

Referring to FIG. 3, a schematic circuit diagram shows a pulsed flop circuit 302 that is suitable for usage in the pulse-based high-speed flip-flop 200 shown in FIG. 2. The pulsed flop circuit 302 includes a push-pull gate driver 304 that operates as a push-pull circuit for driving short-duration pulses to a storage element 306 and an output line 310 via an inverter 308.

The push-pull gate driver 304 has four MOSFETs connected in series in a source-drain pathway between VDD and VSS references including p-channel MOSFETs 312 and 314 and n-channel MOSFETs 316 and 318. P-channel MOSFET 312 and n-channel MOSFET 318 have gate terminals connected to a data signal line data. P-channel MOSFET 314 has a source-drain pathway connected between the p-channel MOSFET 312 and node 320, and has a gate terminal connected to an inverse pulse signal pulse_l. N-channel MOSFET 316 has a source-drain pathway connected between the node 320 and N-channel MOSFET 318, and has a gate terminal connected to a pulse signal pulse.

When the inverse pulse signal pulse_l and the data signal data are simultaneously low, the node 320 is brought high by the p-channel MOSFETs 312 and 314. When the clock signal on pulse and the data signal data are simultaneously high, the node 320 is brought low by the n-channel MOSFETs 316 and 318.

When the pulse signals pulse and pulse_l are asserted, the node 320 holds a value that is the inverse of the data signal on line data. Driving strengths of the transistors 312, 314, 316, and 318 are selected for functionality during data sampling and propagation delay.

The pulsed flop circuit 302 includes a single storage cell 306 including a static memory element or latch. When the pulse signals pulse and pulse_l are asserted, the inverse of the data signal on line data is latched by the storage cell 306.

The single storage cell 306 is connected to the node 320 and thus connected to the data path from the node 320 to an output line 310, but is not inserted into the data path between the node 320 and the output line 310. Specifically, a single line forms the input terminal and the output terminal to the storage cell 306 so that the storage cell 306 does not interpose a delay between the node 320 and inverter 326. The connection of the storage cell 306 outside the path of data flow prevents delay of the data signal, increasing the rate of propagation of the data signal. The resulting improvement in data transmission rate increases the amount of time available for signal computation in a computing system, improving system operating speed. In contrast, a conventional pipeline generally contains conventional storage elements or latches that are located in the path of data flow, slowing the propagation of a signal and reducing the time for signal computation in a processor, resulting in a reduction is processor execution speed.

The pulsed flop circuit 302, by having storage elements outside the data path, has an improved operating speed due to reduced setup time. Setup time is zero or almost zero because data is connected directly to sampling devices. The pulsed flop circuit 302 thus decreases setup time and propagation time. However, data must be held stable during the clock pulse to prevent incorrect data from propagation, thereby increasing hold time. Accordingly, the pulsed flop circuit 302 eliminates timing penalty at the cost of increasing hold time.

Figure 4A:
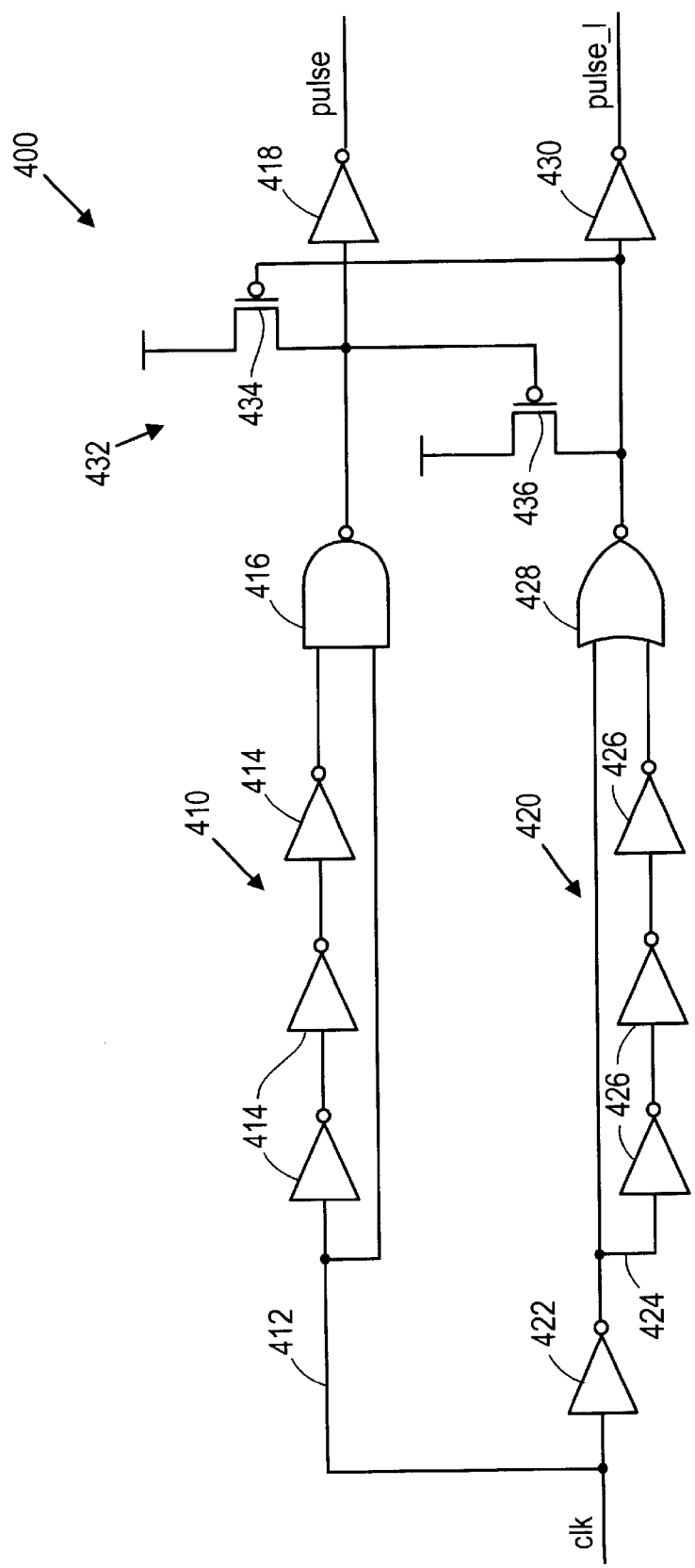
FIGS. 4A, 4B, and 4C are schematic circuit diagrams that depict three examples of a timing generation circuit that are suitable for usage in the pulse-based high-speed flip-flop shown in FIG. 2.
Figure 4B:
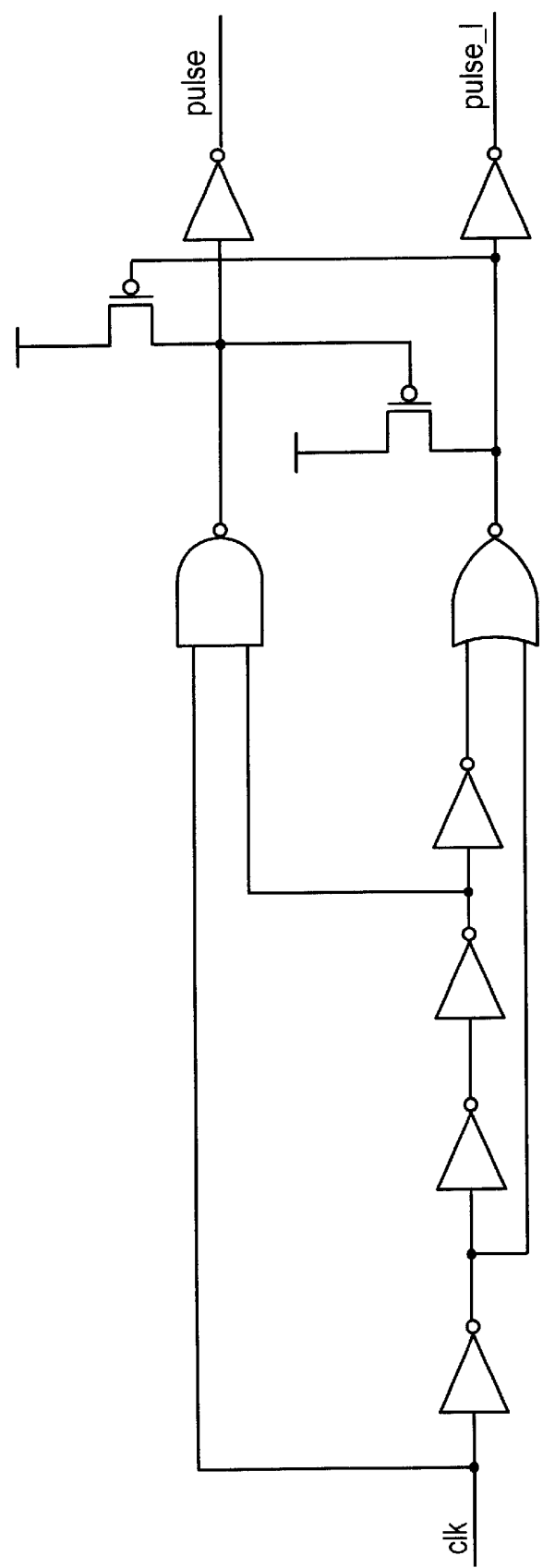

Referring to FIG. 4A, a schematic circuit diagram depicts an example of a timing circuit 400 that is suitable for usage as the clock header circuit 204 shown in FIG. 2. The timing circuit 400 forms a pulse signal from a clock timing signal on a signal line clk. The timing circuit 400 forms the pulse signals pulse and pulse l by passing the clock signal on clock line clk through two delay lines including a pulse clock delay line 410 and an inverse pulse delay line 420. The illustrative pulse clock delay line 410 includes a delay string 412 including a plurality of inverters 414, a NAND gate 416 and an end inverter 418. The illustrative inverse pulse delay line 420 includes a beginning inverter 422, a delay string 424 including a plurality of inverters 426, a NOR gate 428 and an end inverter 430. The number of inverters 414 and the number of inverters 426, respectively determine duration of the pulse and inverted pulse. Illustratively and typically, the number of inverters 414 in the pulse delay line 410 is equal to the number of inverters 426 in the inverse pulse delay line 420 so that the pulse and inverted pulse have the same duration. In other embodiments, the pulse duration of the pulse and inverted pulse may be made equal by techniques other than duplicating the implementation of an inverter string. Although the delay strings 412 and 424 each are shown to include three inverters, in other embodiments fewer or more inverters may be used. One such embodiment is shown in FIG. 4B in which two inverters are common in the delay path.

The timing circuit 400 includes a synchronization circuit 432 connected to output terminals of the NAND gate 416 and the NOR gate 428 to synchronize the pulse signal on the pulse line pulse and the inverted pulse signal on the inverted pulse line pulse_l. In the illustrative example, the synchronization circuit 432 includes P-channel MOSFETs 434 and 436. P-channel MOSFET 434 has a source-drain pathway coupled between a VDD reference and a connection to the output terminal of NAND gate 416 and a gate terminal connected to the output terminal of NOR gate 428. P-channel MOSFET 436 has a source-drain pathway coupled between a VDD reference and a connection to the output terminal of NOR gate 428 and a gate terminal connected to the output terminal of NAND gate 416.

Figure 4C:
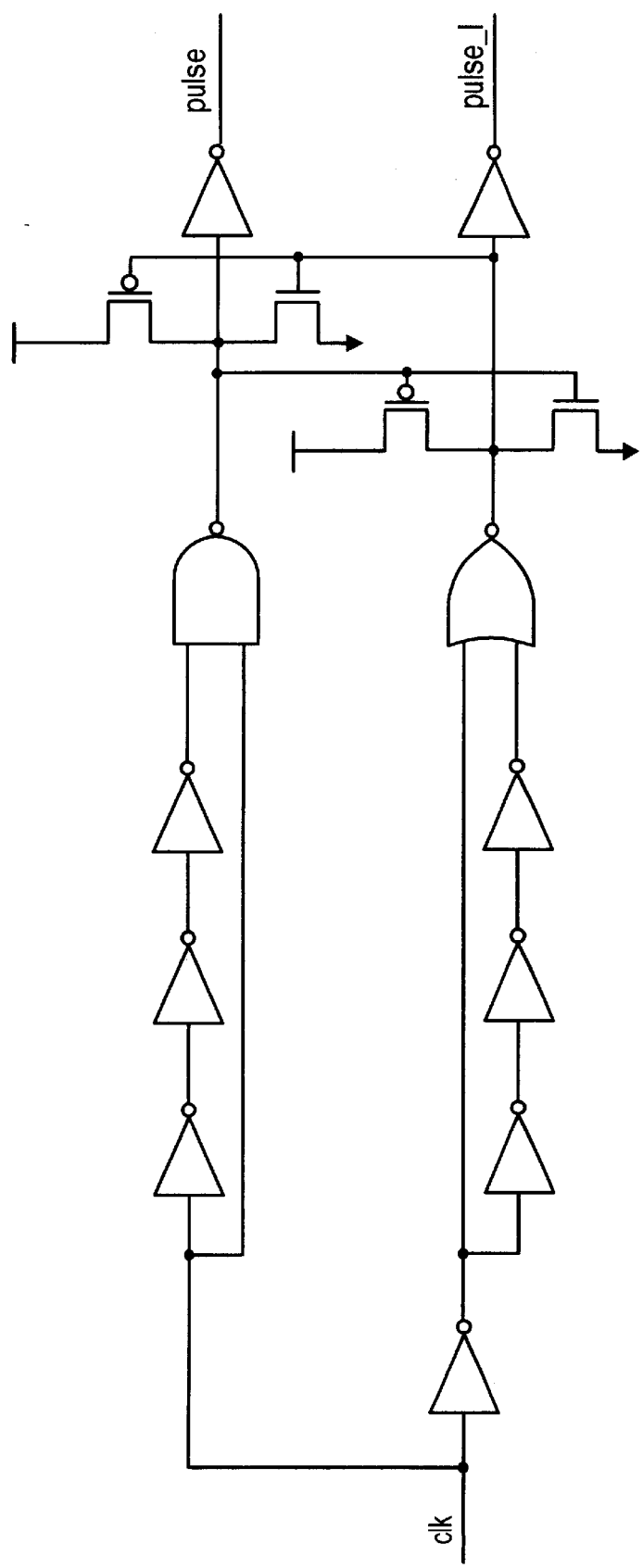

In other embodiments, P-channel MOSFETs 434 and 436 can be replaced by NMOS transistors or by a combination of PMOS and NMOS transistors, as is shown in an alternative embodiment in FIG. 4C.

Figure 5:
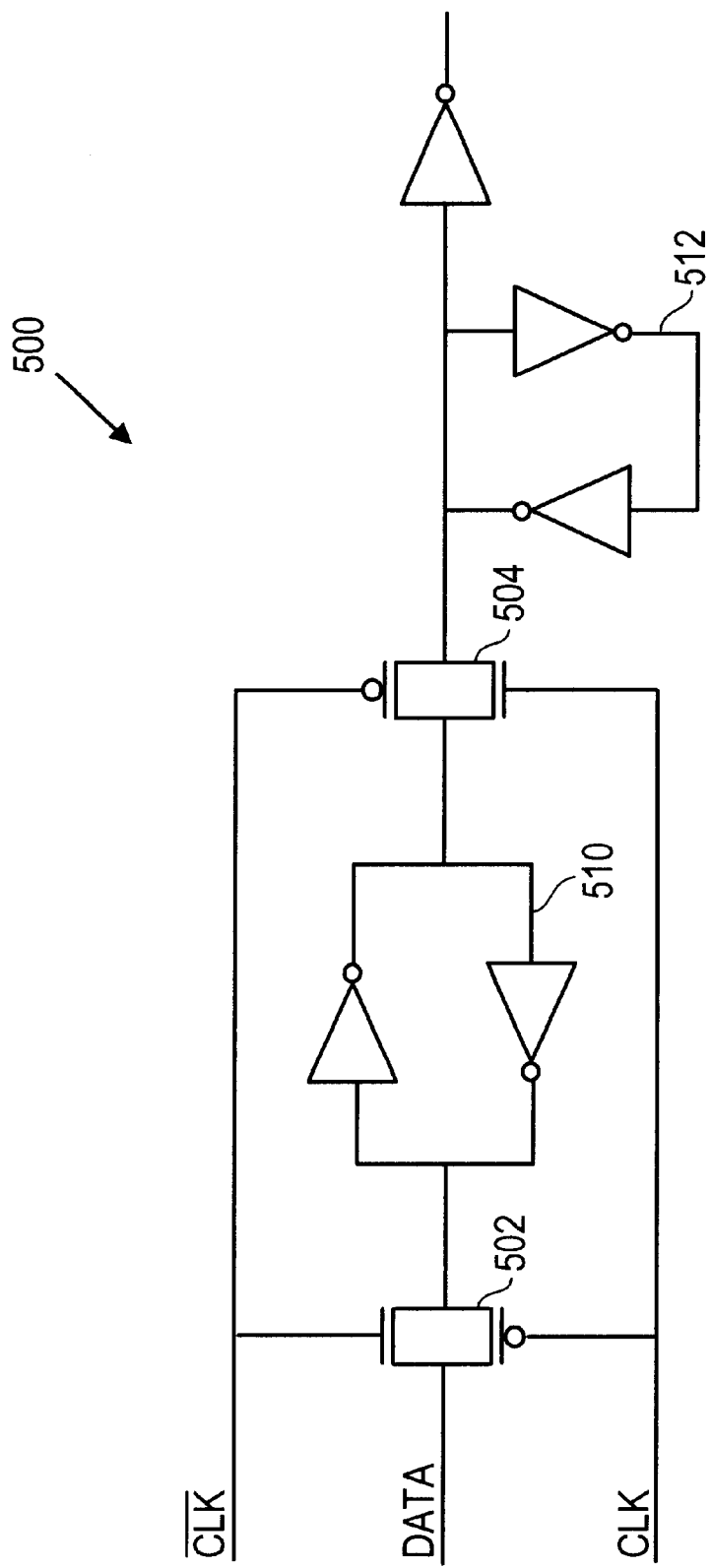
FIG. 5 is a highly schematic circuit diagram depicting a master/slave flip-flop having a setup time $T_S$ that slows speed operation due to imposition of delay in the data path.
Figure 6:
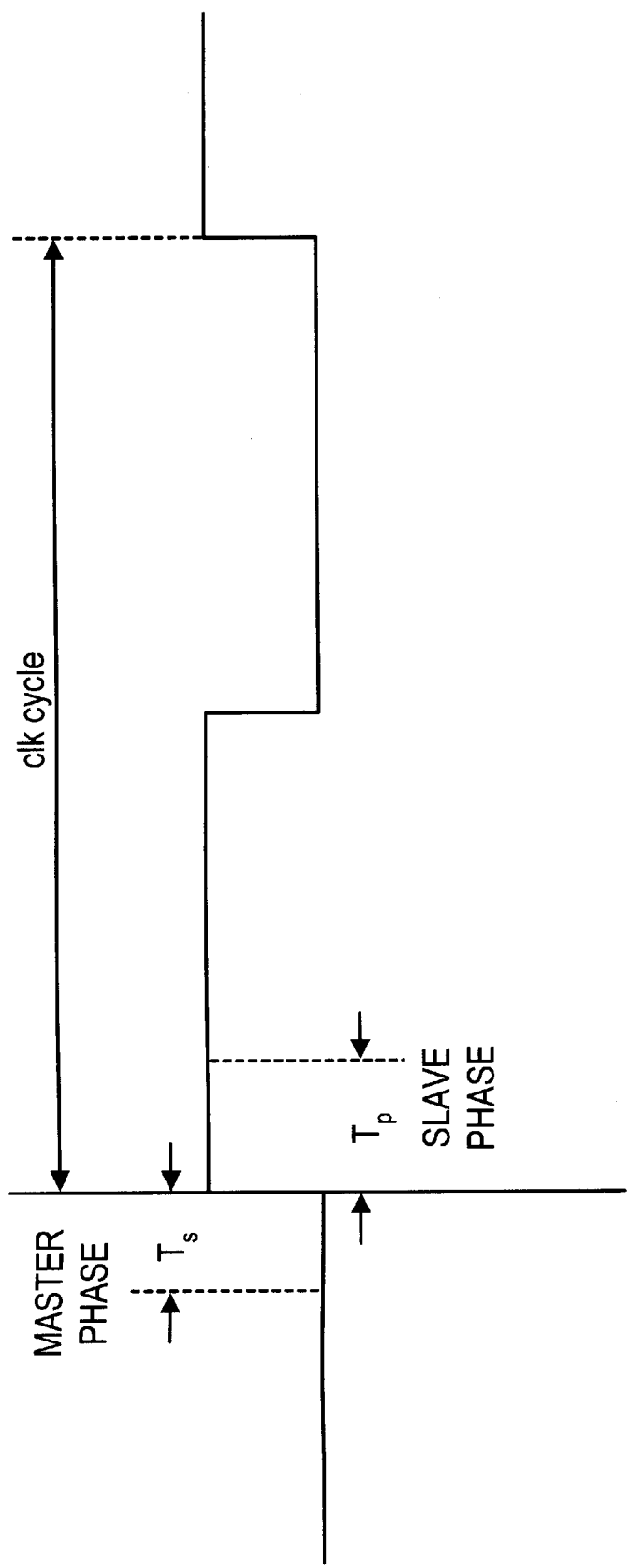
FIG. 6 is a timing diagram that illustrates timing operation of the master/slave flip-flop shown in FIG. 5.

The improvement in operating speed that is achieved by the pulse-based high-speed flip-flop 200 is illustrated by comparison with a typical master/slave flip-flop. Referring to FIG. 5, a highly schematic circuit diagram depicts a master/slave flip-flop 500 having a setup time $T_S$ that slows speed operation due to imposition of delay in the data path. The master/slave flip-flop 500 includes switches 502 and 504 for first storing data in a master storage cell 510 in a master timing phase, then storing the data in a slave storage cell 512 in a slave timing phase. During the setup time $T_S$ shown in a timing diagram in FIG. 6, data passes through and is held in the master storage cell 510. During the propagation time $T_P$, data passes through and is held in the slave storage cell 512. Both the setup time $T_S$ and the propagation time $T_P$ have a duration of one and one-half to two gate delays, reducing operating speed of the circuit.

Figure 7:
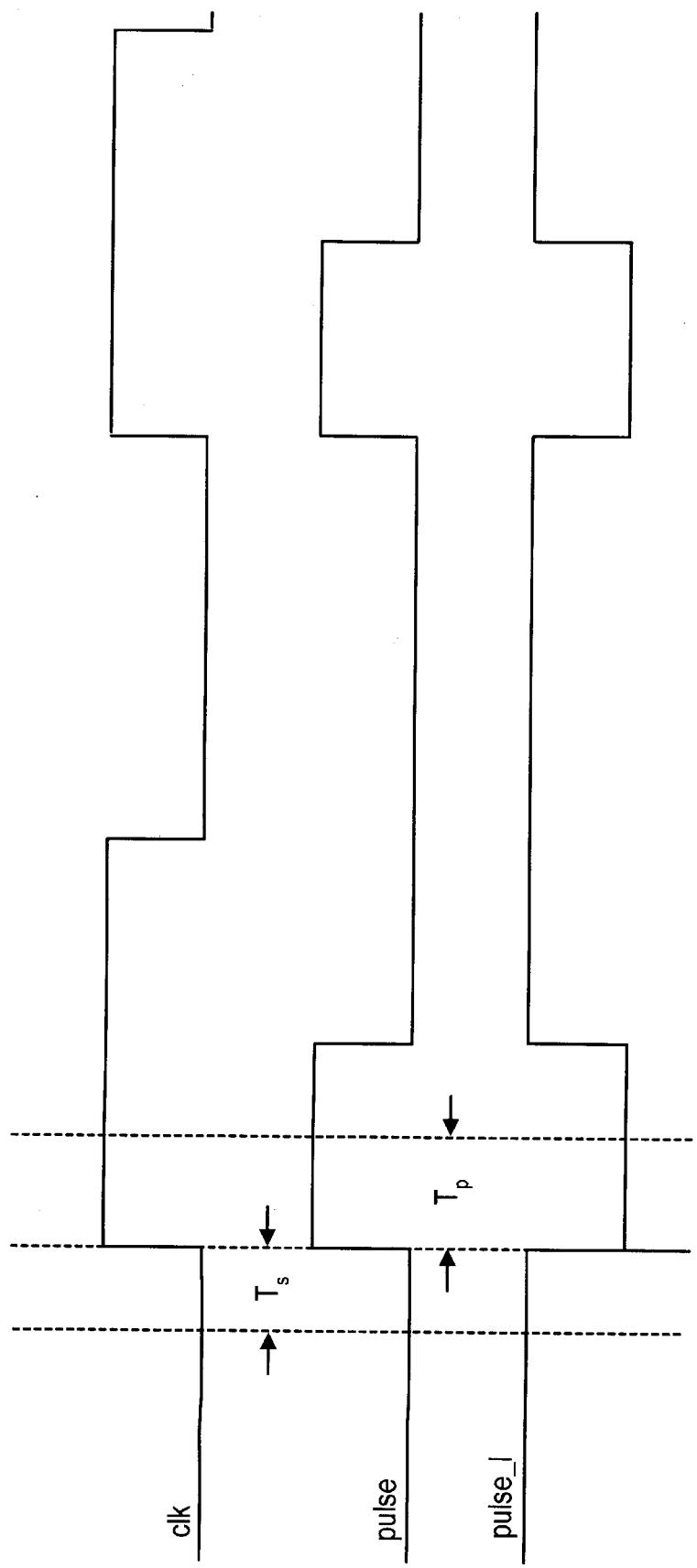
FIG. 7 is a timing diagram illustrating pulsed operation of the pulse-based high-speed flip-flop.

The pulse-based high-speed flip-flop 200 operates as an edge-triggered flip-flop by sampling data during small pulses. The input data is sampled only for a relatively short time interval during which the input data is valid and stable. Referring to FIG. 7 a timing diagram illustrates the pulsed operation of the pulse-based high-speed flip-flop 200 in which the data input signal is sampled only during a hold time $T_H$ when the data is valid and stable.

Figure 8A:
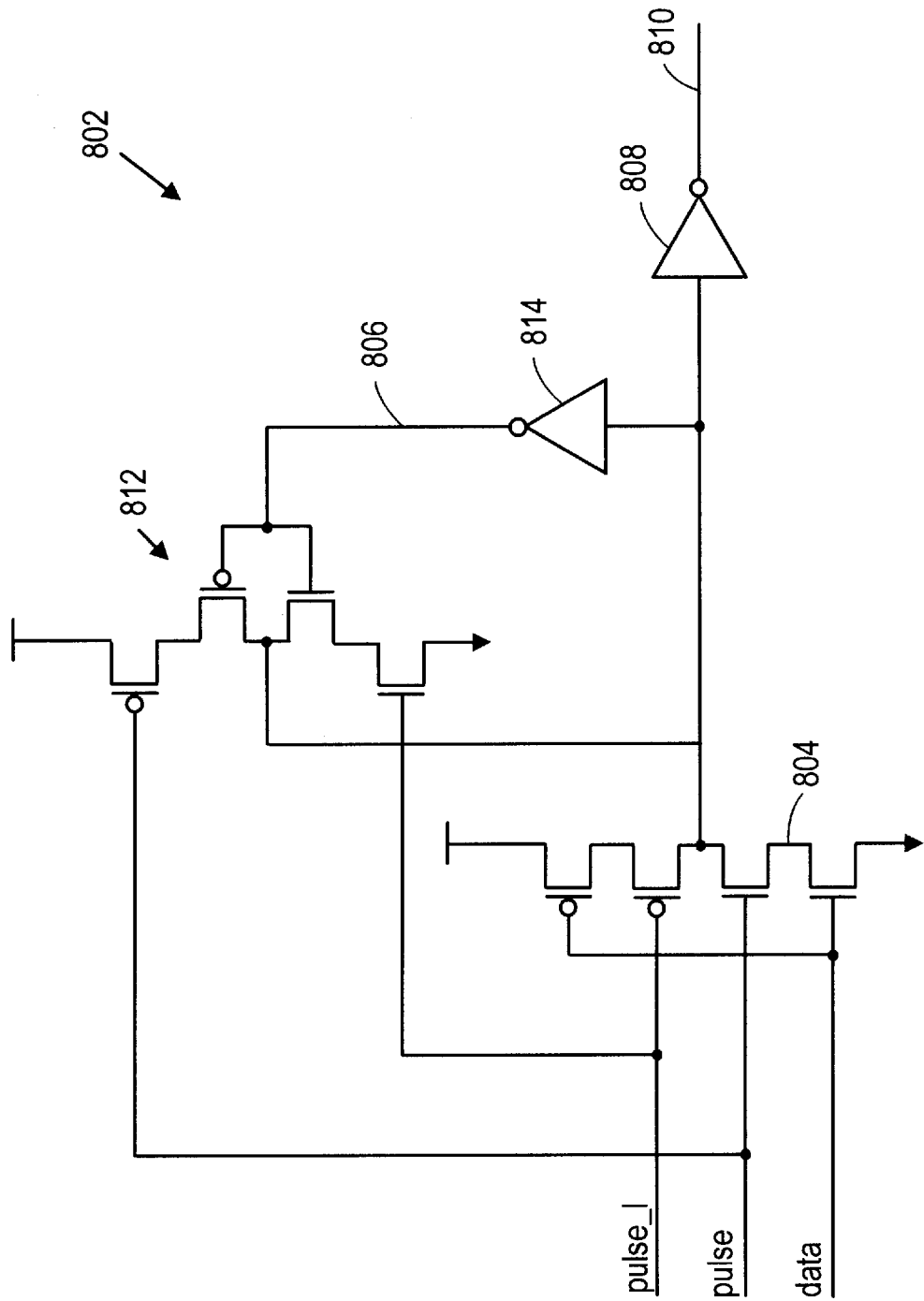
FIGS. 8A and 8B is a schematic circuit diagram showing an alternative embodiment of a pulsed flop circuit that is suitable for usage in the pulse-based high-speed flip-flop.

Referring to FIG. 8A, a schematic circuit diagram shows an alternative embodiment of a pulsed flop circuit 802 that is suitable for usage in the pulse-based high-speed flip-flop 200 shown in FIG. 2. The pulsed flop circuit 802 includes a driver 804 that drives short-duration pulses to a storage element 806 and an output line 810 via an inverter 808. The storage element 806 has a reduced propagation time $T_P$ in comparison to the storage element 306 shown in FIG. 3 by usage of a single inverter 814, rather than paired inverters. The single inverter 814 is connected to a driver circuit 812 that is controlled by the pulse and inverted pulse signals applied to gates of transistors in the driver 804.

Figure 8B:
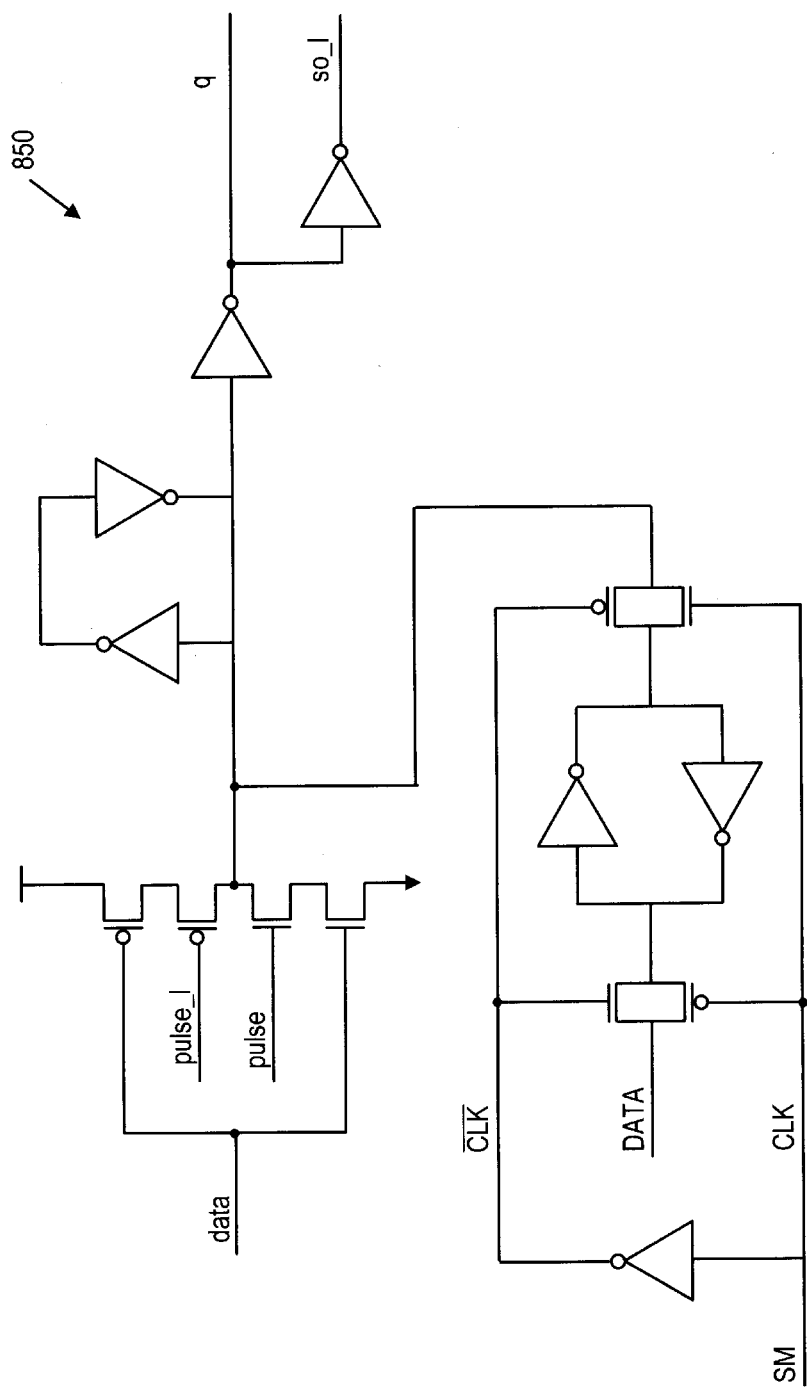

FIG. 8B shows an embodiment of a pulsed flop circuit 850 that includes a scan functionality.

Figure 9A:
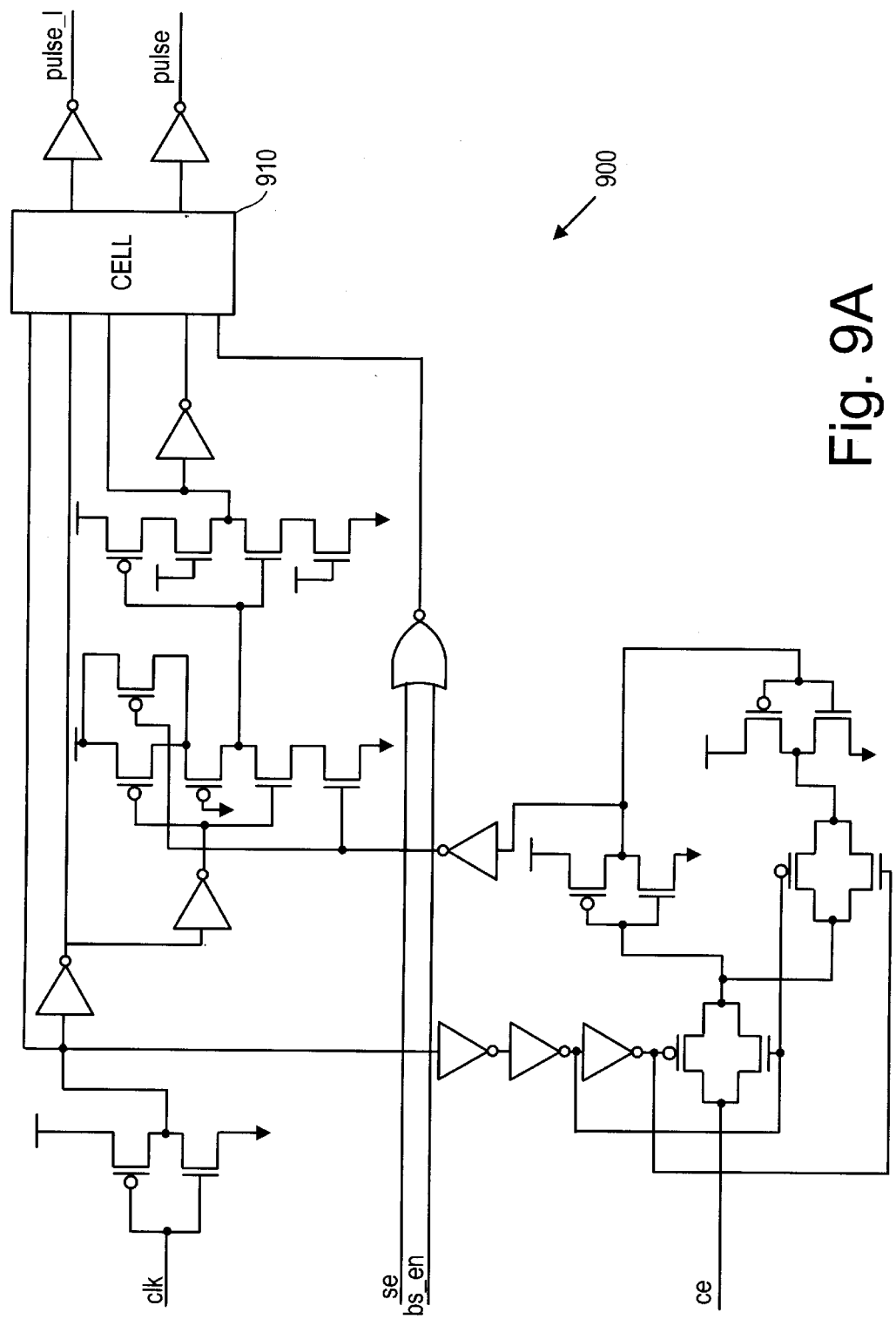
FIGS. 9A and 9B are schematic circuit diagrams that illustrate an alternative embodiment of a timing circuit that is suitable for usage in the pulse-based high-speed flip-flop.
Figure 9B:
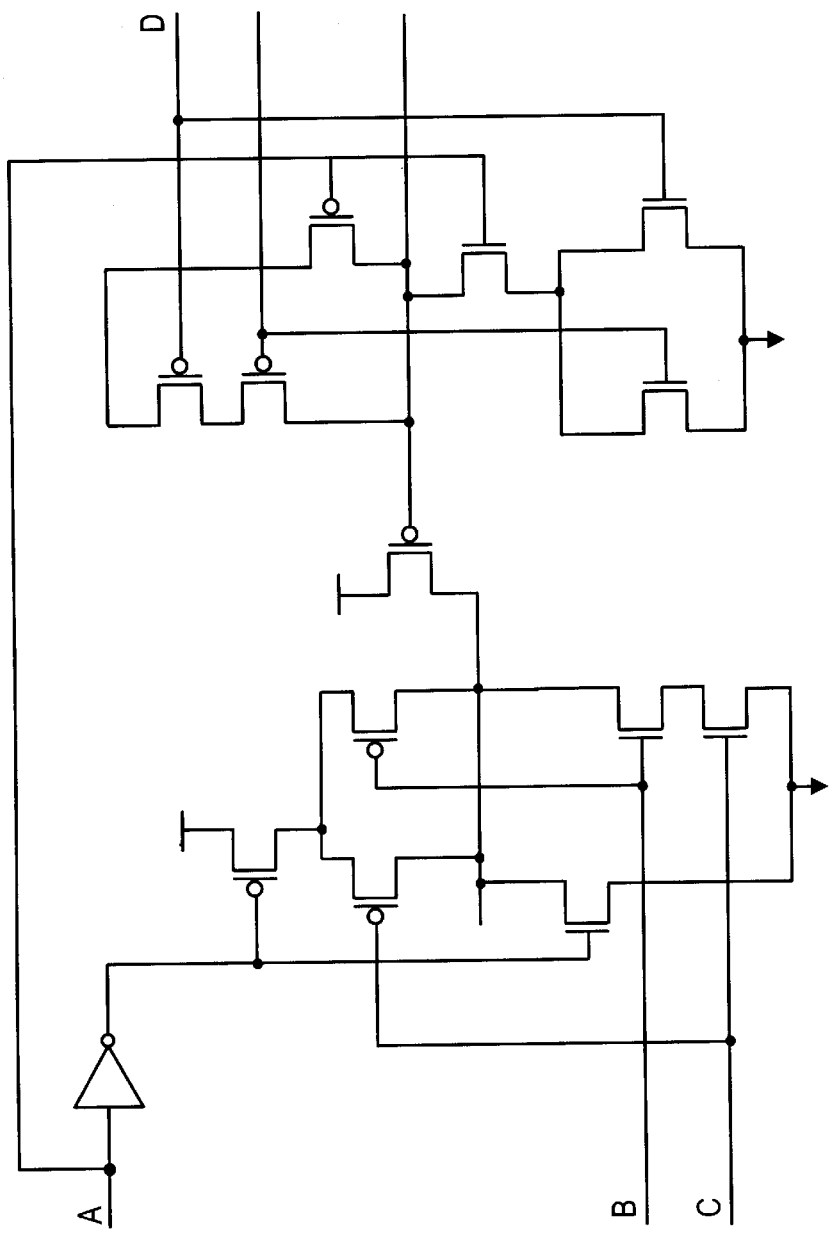

Referring to FIGS. 9A and 9B, schematic circuit diagrams illustrate an alternative embodiment of a timing circuit 900 that is suitable for usage in the pulsed flop circuit 802 or other suitable implementation of pulse-based high-speed flip-flop 200. The timing circuit 900 receives various control signals, for example scan control signals, to perform various operations in different applications, designs, and embodiments.

Figure 10A:
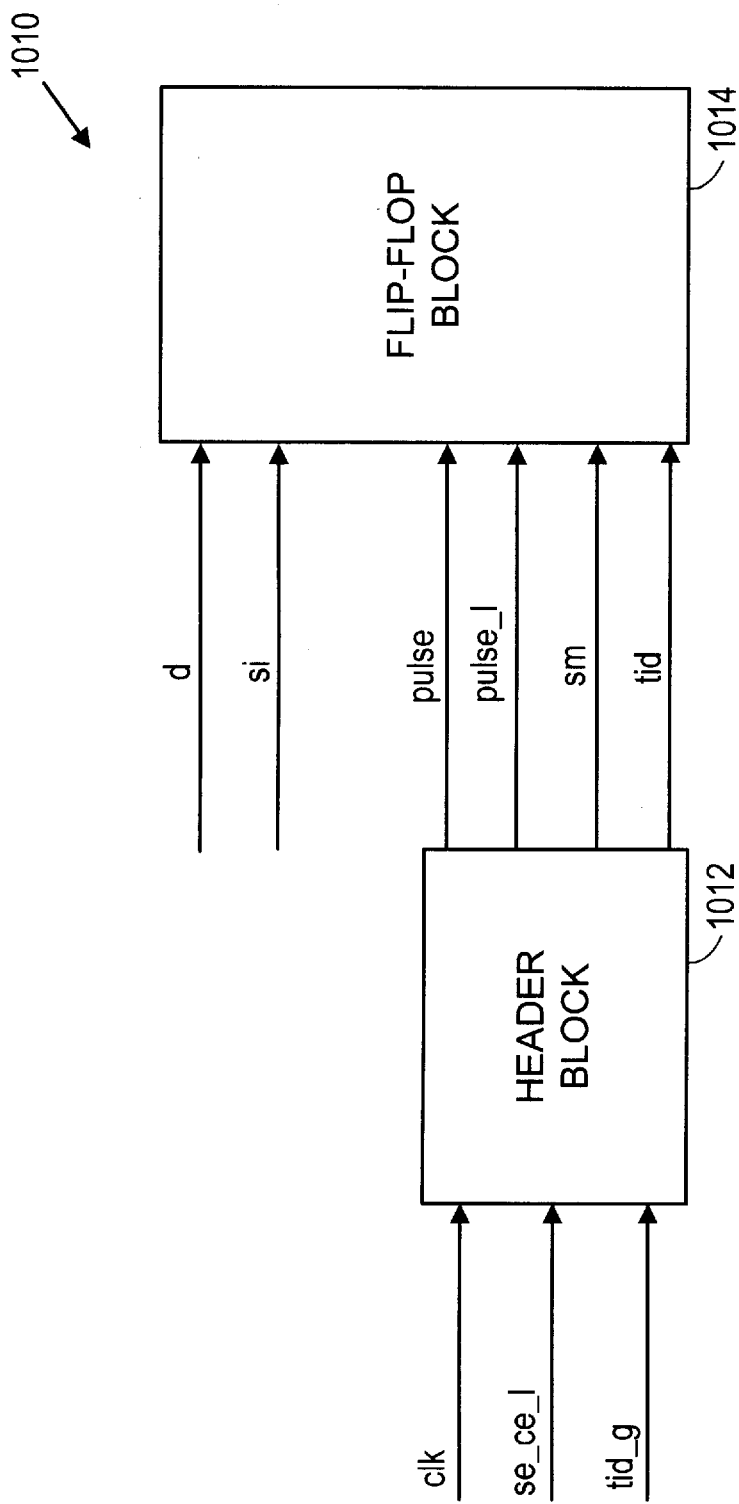
FIGS. 10A, 10B, and 10C are diagrams showing an embodiment of a pulse-based high-speed flip-flop that is advantageously used to attain multithreading in an integrated circuit.

Referring to FIG. 10A, a schematic block diagram illustrates control and storage blocks of a circuit employing high-speed multiple-bit flip-flops. A multiple-bit flip-flop storage block 1010 includes a clock/control header block 1012 and a multiple-bit flip-flop block 1014. The clock/control header block 1012 supplies timing signals and thread select signals to the multiple-bit flip-flop block 1014. Input signals to the clock/control header block 1012 include a clock signal clk that is supplied from external to the multiple-bit flip-flop storage block 1010, a combined scan enable and clock enable signal se_ce_l, and a thread identifier (TID) signal tid_g that is supplied from thread select circuitry external to the multiple-bit flip-flop storage block 1010. The clock/control header block 1012 derives an internal flip-flop pulse signal pulse, the inverse of the internal flip-flop pulse signal pulse_l, and a scan clock signal sm from the external clock clk and the scan enable and clock enable signal se_ce_l. The clock/control header block 1012 asserts an internal thread ID signal tid based on the thread identifier (TID) signal tid_g. The clock/control header block 1012 drives one or more flip-flop cells in the multiple-bit flip-flop block 1014. Typically, the multiple-bit flip-flop block 1014 includes from one to 32 bistable multivibrator cells, although more cells may be used. The internal flip-flop pulse signal pulse, the inverse of the internal flip-flop pulse signal pulse_l, the scan clock signal sm, and the internal thread ID signal tid are supplied from the clock/control header block 1012 to the multiple-bit flip-flop block 1014.

In addition to the internal flip-flop pulse signal pulse, the inverse of the internal flip-flop pulse signal pulse_l, the scan clock signal sm, and the internal thread ID signal tid, the multiple-bit flip-flop block 1014 also receives an input signal d and a scan chain input signal si.

Figure 10B:
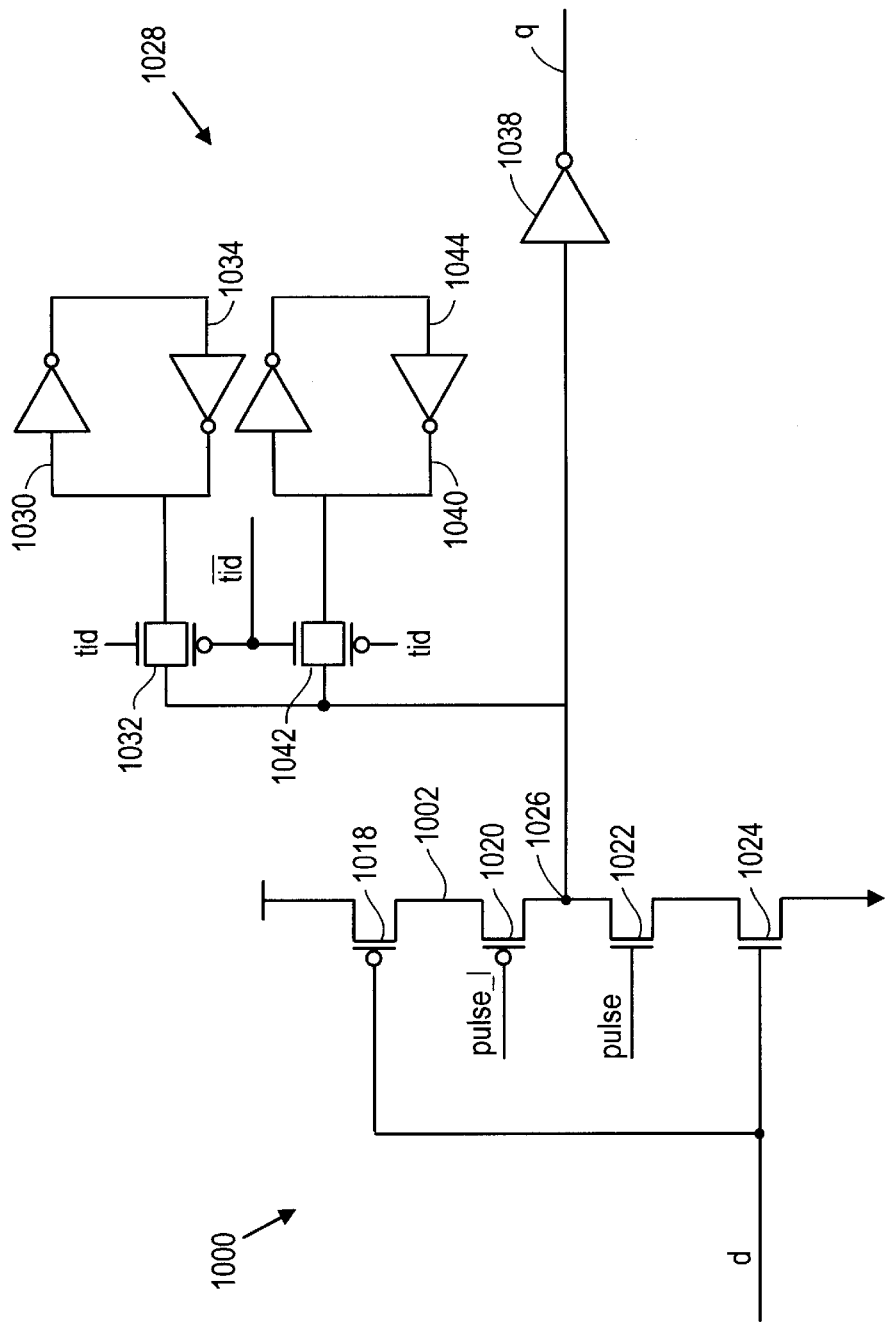

Referring to FIG. 10B, a schematic circuit diagram shows a multiple-bit bistable multivibrator (flip-flop) circuit. A conventional flip-flop is a single-bit storage structure and is commonly used to reliably sample and store data. A flip-flop is typically a fundamental component of a semiconductor chip with a single-phase clock and a major determinant of the overall clocking speed of a microcontroller or microprocessor. A novel pulse-based multiple-bit high-speed flip-flop 1000 is used to accelerate the functionality and performance of a processor.

An individual cell of the pulse-based multiple-bit high-speed flip-flop 1000 includes an input stage with a push-pull gate driver 1002. The push-pull gate driver 1002 operates as a push-pull circuit for driving short-duration pulses to a multiple-bit storage circuit 1028 and an output line q via an inverter 1038. The push-pull gate driver 1002 has four MOSFETs connected in series in a source-drain pathway between VDD and VSS references including a p-channel MOSFET 1018, a p-channel MOSFET 1020, an n-channel MOSFET 1022, and an n-channel MOSFET 1024. P-channel MOSFET 1018 and n-channel MOSFET 1024 have gate terminals connected to the input signal d. The p-channel MOSFET 1020 has a source-drain pathway connected between the p-channel MOSFET 1018 and node 1026, and has a gate terminal connected to the inverse of the internal flip-flop pulse signal pulse_l. The n-channel MOSFET 1022 has a source-drain pathway connected between the node 1026 and the n-channel MOSFET 1024 and a gate terminal connected to the internal flip-flop pulse signal pulse. When the inverse pulse signal pulse_l and the input signal d are simultaneously low, the node 1026 is brought high by the p-channel MOSFET 1018 and the p-channel MOSFET 1020. When the internal flip-flop pulse signal pulse and the input signal d are simultaneously high, the node 1026 is brought low by the n-channel MOSFET 1024 and n-channel MOSFET 1022. Accordingly, the short duration pulses are formed by operation of the p-channel MOSFET 1020 and the n-channel MOSFET 1022 that drive the sample data on input terminal d to the node 1026 on assertion of the pulse signal pulse. When the internal flip-flop pulse signal pulse is asserted, the node 1026 holds a value that is the inverse of the input signal d. Driving strengths of the transistors 1018, 1020, 1022, and 1024 are selected for different functionality during various conditions such as data sampling and propagation, thread switching, and scanning.

The illustrative multiple-bit storage circuit 1028 includes two storage cells 1030 and 1040, although other embodiments may include a single storage cell or more storage cells. A storage cell 1030 or 1040 includes a switch 1032 or 1042, respectively, and a static memory element or latch 1034 or 1044, respectively. The switch is used to select a particular latch according to the thread identifier (TID) that is active during a short-duration clock pulse. When the internal flip-flop pulse signal pulse is asserted, the inverse of the input signal d is latched by the storage cell 1030 or 1040 that is selected by the thread identifier (TID). In the illustrative system, the storage cell 1030 is latched when the TID value is 0 so that the memory element 1034 holds the inverse of the input signal d. Similarly, the storage cell 1040 is latched the value of input signal d when the TID value is 1. Other embodiments of a pulse-based multiple-bit high-speed flip-flop 1000 may be utilized that include additional storage cells, for example using a multiple-bit TID and a plurality of switches, multiplexer, or other functionally equivalent switch to select between storage cells.

The multiple-bit storage circuit 1028 is connected to the node 1026 and thus connected to the data path from the node 1026 to the output line q, but is not inserted into the data path between the node 1026 and the output line q. Specifically, a single line forms the input terminal and the output terminal to the storage cells 1030 and 1040 so that the multiple-bit storage circuit 1028 does not interpose a delay between the node 1026 and the inverter 1038. The connection of the multiple-bit storage circuit 1028 outside the path of data flow prevents delay of the data signal, increasing the rate of propagation of the data signal. The resulting improvement in data transmission rate increases the amount of time available for signal computation in a computing system, improving system operating speed. In contrast, a conventional pipeline generally contains conventional storage elements or latches that are located in the path of data flow, slowing the propagation of a signal and reducing the time for signal computation in a processor, resulting in a reduction is processor execution speed.

The short-duration pulse at the node 1026 activates the static memory element or latch 1034, 1044 selected by the TID. The latches 1034 and 1044 are edge-triggered for sampling data in a small time window, and can be configured for operation with both positive edges and negative edges of pulse signals. The multiple-bit pulse-based high-speed flip-flop 1000 is connected to bus select lines to determine which bit is active of a plurality of bits. At any one time only a single bit is active and the active bit holds and drives an output signal on an output line q via the inverter 1038. When the active bit is switched with one of the inactive bits, the output signal of the latch 1034 or 1044 changes accordingly.

Bits of the pulse-based high-speed flip-flop 1000 may be made scannable selectively.

In one example, the high-speed flip-flop 1000 is a pulse-based flip-flop that replaces a single-bit master-slave flip-flop. Other types of flip-flops, which are well-known to those having ordinary skill in the electronics arts may be converted to multiple-bit flip-flops for usage in a multi-threaded processor.

Figure 10C:
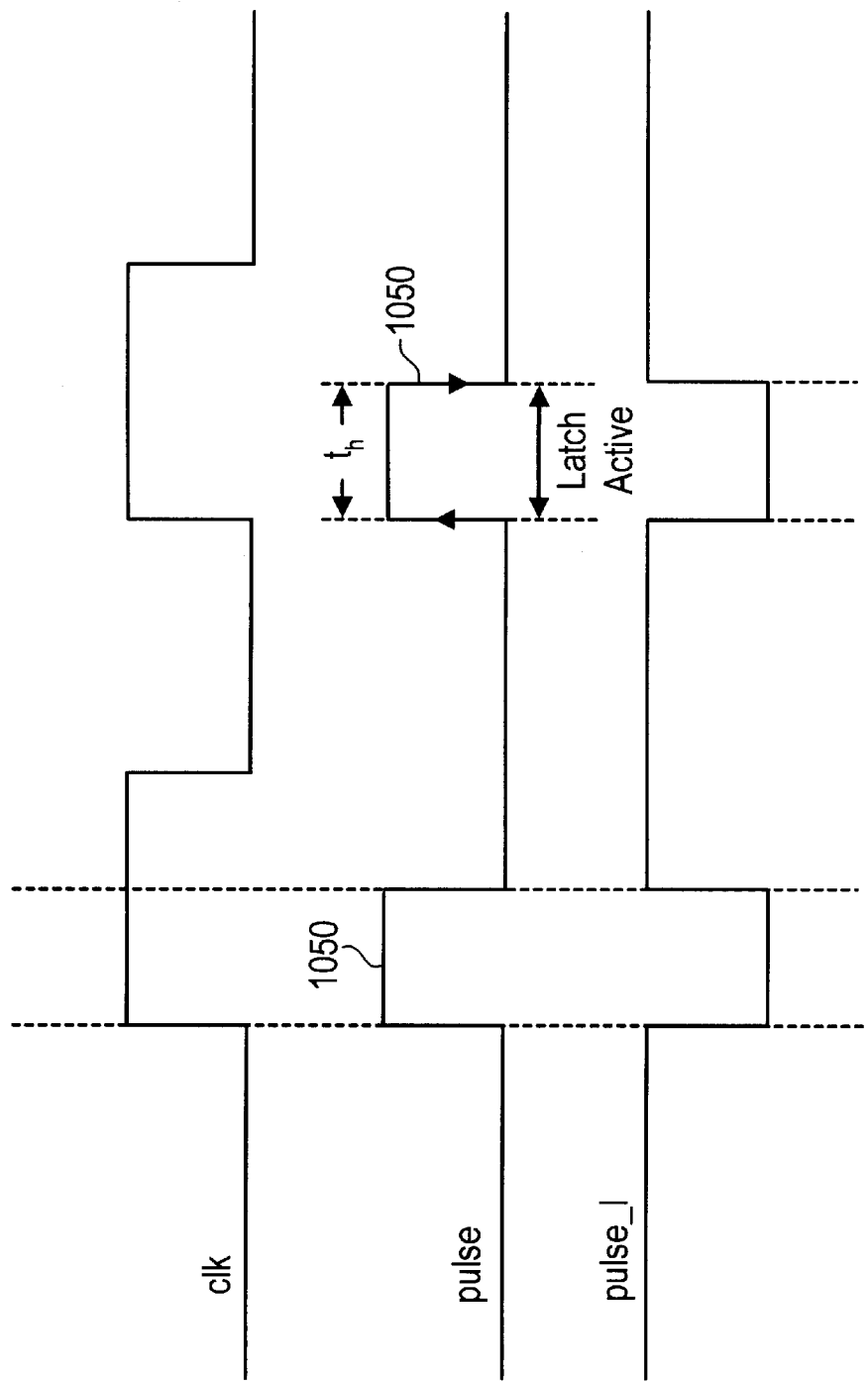

Referring to FIG. 10C, a timing diagram illustrates timing of the multiple-bit flip-flop 1000. The clock/control header circuit produces pulse and pulse__l signals with reference to clk signal. Data d determines the output level on output line q when pulse goes HIGH and pulse__l goes LOW. During the pulse and pulse__l signals, the inverse of the input signal d is latched onto the storage cell 1030 or the storage cell 1040 as determined by the thread identifier (TID). The flip-flop 1000 samples the signal in a small time-duration window to produce an edge-trigger functionality.

During the pulse and pulse__l signal, the internal node 1026 holds the inverse value of data d. When pulse and pulse__l are no longer asserted, the signal at the node 1026 is determined by the storage cells 1030 and 1040, determined by the TID control signal.

In the illustrative pulse-based high-speed flip-flop 1000, the latches 1034 and 1044 are advantageously removed from the direct path of signal propagation and thus do not degrade signal speed. The pulse-based high-speed flip-flop 1000 has a zero or very small setup time but a relatively long hold time.

In contrast, a conventional flip-flop may include a storage element that is in the path of data flow, slowing propagation of the signal and shortening the time duration that is left for signal computation, thereby reducing system operating speed. The described flip-flop 1000 includes a storage element that is not in the direct path of signal propagation and does not hinder system operating speed.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims. For example, although the illustrative processors include a specified number of threads per pipeline and a specified number of pipelines per integrated circuit chip, various other numbers of threads and pipelines may be implemented in other examples, depending on desired processor applications, semiconductor fabrication techniques, and various size parameters of the processor.

The descriptions contained herein relate to many aspects of processor structure and operating techniques, including structural and functional aspects of various processor components. The structures and techniques are described that are highly useful in combination. However, various structures and techniques are also innovative and highly advantageous when employed alone or in multiple various subcombinations. The invention is to be limited by the claims alone and various limitations that are described in the specification but not included in a particular Claim are not to be considered inherent to the claim merely by inclusion in the specification.

CROSS-REFERENCE

The present invention is related to subject matter disclosed in the following co-pending patent applications that are incorporated by reference herein in their entirety:

1. U.S. patent application Ser. No. 09/638,338 entitled, "High Speed Multiple-Bit Flip-Flop", naming G. P. Singh as inventor and filed on even date herewith.

What is claimed is:

1. An integrated circuit device for synchronization of data in a data path comprising:
   a driver;
   a storage element coupled to the driver, the driver for driving the storage element, the storage element being coupled to the data path outside the data path;
   a pulse timing control circuit coupled to the driver and forming from a clock signal a pulse signal and an inverted pulse signal, the pulse timing control circuit including:
      first and second delay lines that are respectively coupled to first and second logic elements having a first input connection to a signal coupled prior to the delay line and a second input connection to a signal coupled subsequent to the delay line, the first and second logic elements forming mutually inverse output signals.

2. An integrated circuit device according to claim 1 further comprising a mutual control interconnection between the mutually inverse output signals that synchronize the mutually inverse output signals.

3. An integrated circuit device according to claim 1 wherein:
   the driver is an edge-triggered driver configured to trigger on either the positive edge or the negative edge.

4. An integrated circuit device according to claim 1 wherein:
   the storage element is a static memory element that samples data in a short-duration time window defined by the pulse signal and the inverted pulse signal for edge-triggered functionality.

5. An integrated circuit device according to claim 1 wherein the driver further comprises:
   a plurality of transistors coupled along a common source-drain pathway, the plurality of transistors including:

a first pair of complementary transistors each having a gate terminal coupled to a data line; and a second pair of complementary transistors, a first transistor of the second pair of complementary transistors having a gate terminal coupled to the pulse signal and a second transistor of the second pair of complementary transistors having a gate terminal coupled to the inverted pulse signal complementary to the pulse signal.

6. An integrated circuit device according to claim 1 wherein the storage element comprises a single inverter and a second driver.

7. An integrated circuit device according to claim 6 wherein the second driver is controlled by the pulse signal and the inverted pulse signal.

8. An integrated circuit device according to claim 1 further comprising a multiple-bit storage circuit comprising a plurality of storage elements.

9. A processor comprising:

a control logic for executing computational and logic operations; and a memory coupled to the control logic, the control logic and the memory including a plurality of flip-flops for synchronization of data in a data path, the flip-flops including:

a driver;

a storage element coupled to the driver, the driver for driving the storage element, the storage element being coupled to the data path outside the data path;

a pulse timing control circuit coupled to the driver and forming from a clock signal a pulse signal and an inverted pulse signal, the pulse timing control circuit including:

first and second delay lines that are respectively coupled to first and second logic elements having a first input connection to a signal coupled prior to the delay line and a second input connection to a signal coupled subsequent to the delay line, the first and second logic elements forming mutually inverse output signals.

10. A processor according to claim 9 further comprising a mutual control interconnection between the mutually inverse output signals that synchronize the mutually inverse output signals.

11. A processor according to claim 9 wherein:

the driver is an edge-triggered driver configured to trigger on either the positive edge or the negative edge.

12. A processor according to claim 9 wherein:

the storage element is a static memory element that samples data in a short-duration time window defined by the pulse signal and the inverted pulse signal for edge-triggered functionality.

13. A processor according to claim 9 wherein the driver further comprises:

a plurality of transistors coupled along a common source-drain pathway, the plurality of transistors including:

a first pair of complementary transistors each having a gate terminal coupled to a data line; and a second pair of complementary transistors, a first transistor of the second pair of complementary transistors having a gate terminal coupled to the pulse signal and a second transistor of the second pair of complementary transistors having a gate terminal coupled to the inverted pulse signal complementary to the pulse signal.

14. A processor according to claim 9 wherein the storage element comprises a single inverter and a second driver.

15. A processor according to claim 14 wherein the second driver is controlled by the pulse signal and the inverted pulse signal.

16. A processor according to claim 9 further comprising a multiple-bit storage circuit comprising a plurality of storage elements.

* * * * *